(12) United States Patent
Sharan et al.

(10) Patent No.: US 7,022,618 B2
(45) Date of Patent: Apr. 4, 2006

(54) METHOD OF FORMING A CONDUCTIVE CONTACT

(75) Inventors: Sujit Sharan, Boise, ID (US); Gurtej S. Sandhu, Boise, ID (US); Guy T. Blalock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 134 days.

(21) Appl. No.: 10/664,739

(22) Filed: Sep. 18, 2003

(65) Prior Publication Data

US 2004/0063314 A1 Apr. 1, 2004

Related U.S. Application Data

(62) Division of application No. 10/013,615, filed on Oct. 19, 2001, which is a division of application No. 09/360,292, filed on Jul. 22, 1999.

(51) Int. Cl.
*H01L 21/461* (2006.01)

(52) U.S. Cl. ...................................... 438/721; 438/706

(58) Field of Classification Search ................. 438/721, 438/706–710, 672–674, 637–639, 700
See application file for complete search history.

(56) References Cited

U.S. PATENT DOCUMENTS

| | | | |
|---|---|---|---|
| 5,037,506 A | 8/1991 | Gupta et al. |
| 5,129,958 A | 7/1992 | Nagashima et al. |
| 5,135,775 A | 8/1992 | Foller et al. |
| 5,308,950 A | 5/1994 | Ramm et al. |
| 5,320,708 A | 6/1994 | Kadomura et al. |
| 5,391,513 A | 2/1995 | Delgado et al. |
| 5,643,407 A | 7/1997 | Chang |
| 5,658,829 A | 8/1997 | Mathews et al. |
| 5,704,986 A | 1/1998 | Chen et al. |
| 5,747,116 A | 5/1998 | Sharan et al. |
| 5,770,100 A | 6/1998 | Fukuyama et al. |
| 5,780,359 A | 7/1998 | Brown et al. |
| 5,786,272 A | 7/1998 | Marangon et al. |
| 5,811,022 A | 9/1998 | Savas et al. |
| 5,817,572 A | 10/1998 | Chiang et al. |
| 5,880,005 A | 3/1999 | Tsai et al. |
| 5,888,309 A | 3/1999 | Yu |
| 5,900,288 A | 5/1999 | Kuhman et al. |
| 5,902,134 A | 5/1999 | Egashira |
| 5,925,501 A | 7/1999 | Zhang et al. |
| 6,020,254 A | 2/2000 | Taguwa |
| 6,051,503 A | 4/2000 | Bhardwaj et al. |
| 6,086,960 A | 7/2000 | Kim et al. |
| 6,093,655 A | 7/2000 | Donohoe et al. |
| 6,153,530 A | 11/2000 | Ye et al. |
| 6,159,852 A | 12/2000 | Nuttall et al. |
| 6,171,717 B1 | 1/2001 | Chang et al. |
| 6,204,192 B1 | 3/2001 | Zhao et al. |

(Continued)

*Primary Examiner*—Dung A. Le
(74) *Attorney, Agent, or Firm*—Wells St. John P.S.

(57) ABSTRACT

In one implementation, an etching process includes forming a carbon containing material over a substrate and plasma etching at a temperature of at least 400° C. using a hydrogen or oxygen containing plasma. In one implementation, a plasma etching process includes forming openings in a masking layer over a substrate and etching material beneath the masking through the openings. The masking layer is removed and the substrate is plasma etched at a temperature of at least 400° C. In one implementation, an etching process includes forming a residue over the substrate during a first etching and subsequently plasma etching to remove the residue. In one implementation, a chemical vapor deposition process includes positioning a semiconductor substrate within a plasma enhanced chemical vapor deposition reactor, plasma etching using a first gas chemistry, depositing a material over the substrate within the reactor using a second gas chemistry.

7 Claims, 3 Drawing Sheets

U.S. PATENT DOCUMENTS

| | | |
|---|---|---|
| 6,218,084 B1 | 4/2001 | Yang et al. |
| 6,228,775 B1 * | 5/2001 | Coburn et al. .............. 438/714 |
| 6,277,733 B1 | 8/2001 | Smith |
| 6,285,038 B1 | 9/2001 | Rhodes |
| 6,325,861 B1 | 12/2001 | Stinnet |
| 6,458,651 B1 | 10/2002 | Rhodes |
| 6,458,700 B1 | 10/2002 | Rhodes |
| 2002/0074312 A1 | 6/2002 | Ou-Yang et al. |

* cited by examiner

METHOD OF FORMING A CONDUCTIVE CONTACT

CROSS REFERENCE TO CO-PENDING APPLICATION

The subject matter of the present application is a DIV and is related to the application Ser. No. 10/013,615 filed Oct. 19, 2001 which is a DIV of 09/360,292 filed on Jul. 22, 1999.

TECHNICAL FIELD

This invention relates to plasma etching processes and to chemical vapor deposition processes of depositing materials over semiconductor substrates.

BACKGROUND OF THE INVENTION

In the processing of integrated circuits, electrical contact is typically made to isolated active device regions formed within a wafer substrate typically comprising monocrystalline silicon. The active regions are typically connected by high electrically conductive paths or lines which are fabricated above an insulative material formed over the substrate surface. Further, electrical contact is also typically made to other conductive regions received outwardly of the wafer, such as to conductive lines, contact plugs and other devices. To provide electrical connection between two conductive regions, an opening in an insulative layer is typically etched to the desired regions to enable subsequently formed conductive films to make electrical connection with such regions.

The drive for integrated circuits of greater complexity, performance and reduced size has driven designers to shrink the size of devices in the horizontal plane. Yet to avoid excessive current density, the horizontal scaling has not necessarily been accompanied by a reduction in the vertical dimension. This has resulted in an increase of the ratio of device height to device width, something generally referred to as aspect ratio, and particularly with respect to contact openings.

Increased aspect ratio can result in difficulties in the overall etching process typically used to etch openings through insulative materials for making an electrical contact. For example, one common insulating material within or through which electrical contact openings are etched is borophosphosilicate glass (BPSG). A typical process for etching a contact opening in such material includes dry anisotropic etching, with or without plasma. The ever increasing aspect ratios of contact openings has been accompanied by undesired deposits or residue remaining behind on the sidewalls or base of the contact openings at the conclusion of the etch. This residue is typically in the form of a tenacious and insulative carbon polymer derived from one or both of photoresist which is undesirably removed during the etch or the etching gases themselves used to etch the contact opening through the insulator. The insulative residue at best reduces the contact area available for the desired region to which electrical connection is to be made. At worst, it can completely occlude subsequently deposited conductive material from making suitable electrical contact with the desired region. Residue material might also be present in the form of native silicon dioxide and sub-stoichiometric oxide. Such can by themselves increase contact resistance, particularly with sub-stoichiometric oxide which adversely affects silicidation when forming silicide contacts.

While the invention was principally motivated and resulted from achieving solutions to the above-identified problems, the invention is not so limited, with the scope being defined by the accompanying claims as literally worded and interpreted in accordance with the Doctrine of Equivalents.

SUMMARY OF THE INVENTION

The invention comprises plasma etching processes and chemical vapor deposition processes of depositing a material over a semiconductor substrate. In one implementation, a plasma etching process comprises forming a carbon containing material over a semiconductor substrate. The carbon containing material is plasma etched from the substrate at a temperature of at least 400° C. using a hydrogen or oxygen containing plasma.

In one implementation, a plasma etching process includes forming a masking layer over a substrate. The masking layer is patterned to form openings therein. Material beneath the masking layer is etched through the openings. After such etching, the masking layer is removed from the substrate. After such removing and before subsequently depositing any material over the substrate, the substrate is plasma etched at a temperature of at least 400° C.

In one implementation, a semiconductor plasma etching process comprises first etching material from a substrate and forming an undesired residue at least partially over the substrate during the first etching. After the first etching and before subsequently depositing any material over the substrate, the undesired residue is plasma etched from the substrate.

In one implementation, a chemical vapor deposition process of depositing a material over a semiconductor substrate comprises positioning a semiconductor substrate within a plasma enhanced chemical vapor deposition reactor. The substrate is plasma etched within the reactor using a first gas chemistry. After the plasma etching, a material is chemical vapor deposited over the semiconductor substrate within the reactor using a second gas chemistry without removing the substrate from the reactor between the etching and the depositing.

In one implementation, a method of forming a conductive contact includes forming an insulative material over a silicon comprising substrate. An opening is formed into the insulative material over a node location on the silicon comprising substrate to which electrical connection is desired. First plasma etching is conducted within the opening using a gas chemistry comprising hydrogen and exposing silicon of the substrate to said plasma hydrogen. After the first plasma etching, second plasma etching is conducted within the opening using a gas chemistry comprising chlorine. After the second plasma etching, a silicide material is formed within the opening in contact with silicon of the substrate.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
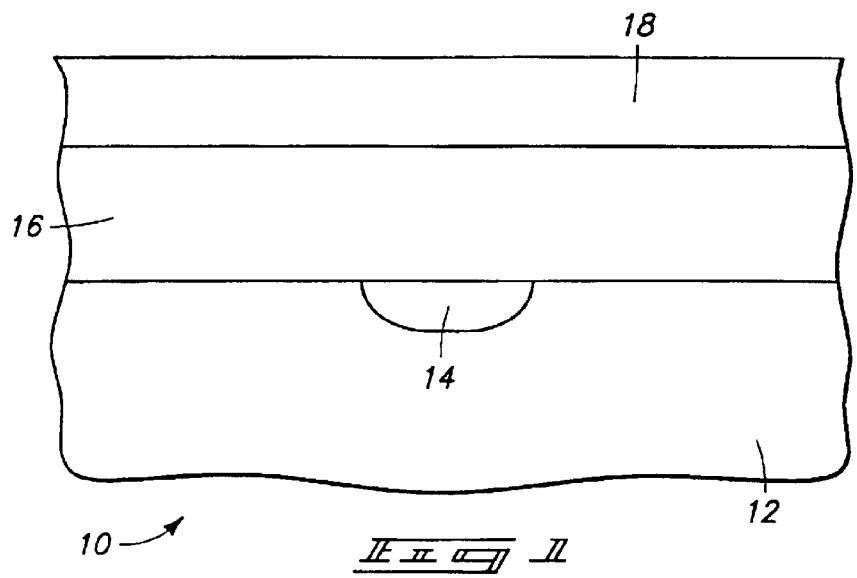
FIG. 1 is a diagrammatic fragmentary view of a semiconductor wafer fragment at one processing step in accordance with the invention.

Referring to FIG. 1, a semiconductor wafer fragment is indicated generally with reference numeral 10. Such comprises a bulk monocrystalline silicon semiconductor substrate 12 having an exemplary conductive diffusion region 14 formed therein. In the context of this document, the term "semiconductor substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An electrically insulative layer 16, such as BPSG, is formed over substrate 12. A masking layer 18 is formed thereover. An example and preferred material for layer 18 is photoresist, whereby photolithography will be utilized to pattern a contact opening to diffusion region 14. Any other masking layer, whether conductive or insulative, is contemplated, with silicon dioxide and silicon nitride being examples utilized alone or in combination with other overlying masking layers. Further, no masking layer might be utilized.

Figure 2:
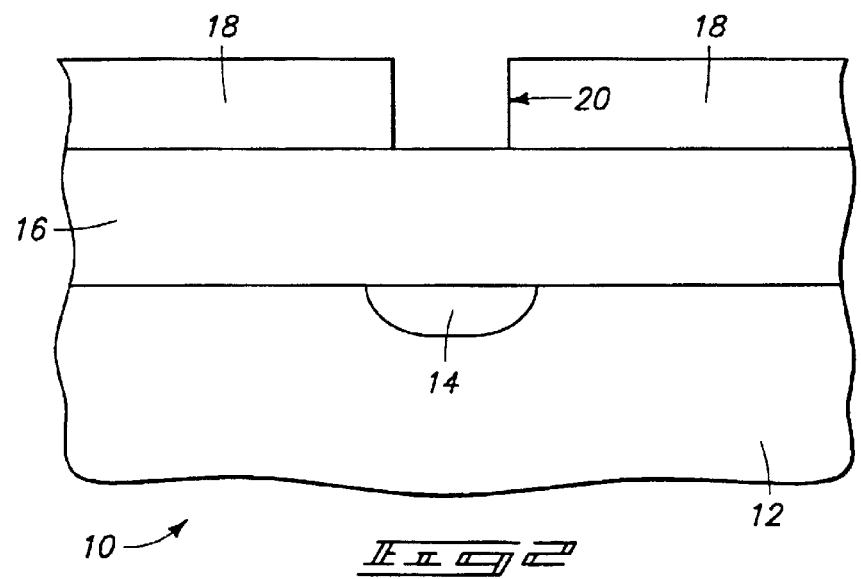
FIG. 2 is a view of the FIG. 1 wafer at a processing step subsequent to that shown by FIG. 1.

Referring to FIG. 2, masking layer 18 is patterned to form openings therein (preferably therethrough), such as illustrated opening 20 over diffusion region 14.

Figure 3:
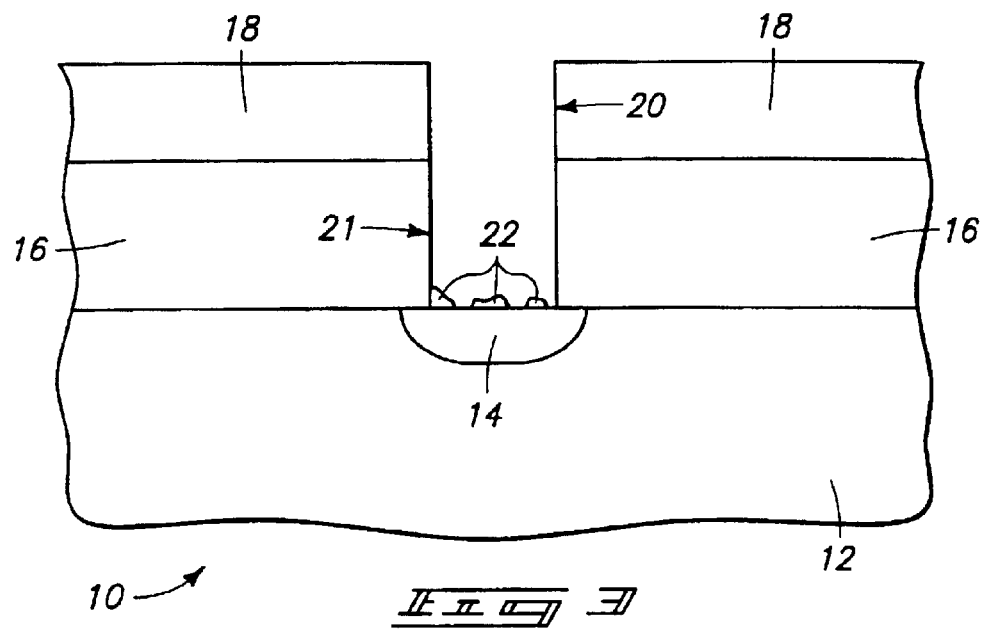
FIG. 3 is a view of the FIG. 1 wafer at a processing step subsequent to that shown by FIG. 2.

Referring to FIG. 3, layer 16 beneath masking layer 18 through opening 20 is etched from the substrate. Such etching is preferably a dry anisotropic etch, with or without plasma, and is conducted to form an opening 21 and outwardly expose region 14, and is conducted substantially selective relative to layer 16 and region 14. An example dry etching gas chemistry would include carbon and halogen components, with $CF_4$ being but one example. Wet or other etching could also be conducted, but the invention is described principally with respect to the above Background section-described problem which motivated the invention. Etching in the described or other manners can undesirably produce residue or deposits 22 at least partially over the substrate during the first etching, such as within the base of the contact opening as shown. Such are typically in the form of carbon containing polymers resulting from one or both of photoresist material undesirably removed during the etch or from the etching gases themselves.

The above-described and depicted processing is but one example whereby some material is etched from a substrate and an undesired residue is formed at least partially over the substrate during the etch. Such also is but one method of forming a carbon containing material over a semiconductor substrate. Alternate etchings which form a residue and alternate methods of forming carbon containing materials are of course contemplated. By way of example only, a carbon containing material might be formed over a semiconductor substrate by a deposition, cleaning, other etching or other processes. Further by way of example only, an undesired residue which may or may not be a carbon containing polymer could be formed over the substrate by other etching processes, including but not limited to wet or dry etching and etching process where conductive materials are being etched to form conductive lines or other device components.

Figure 4:
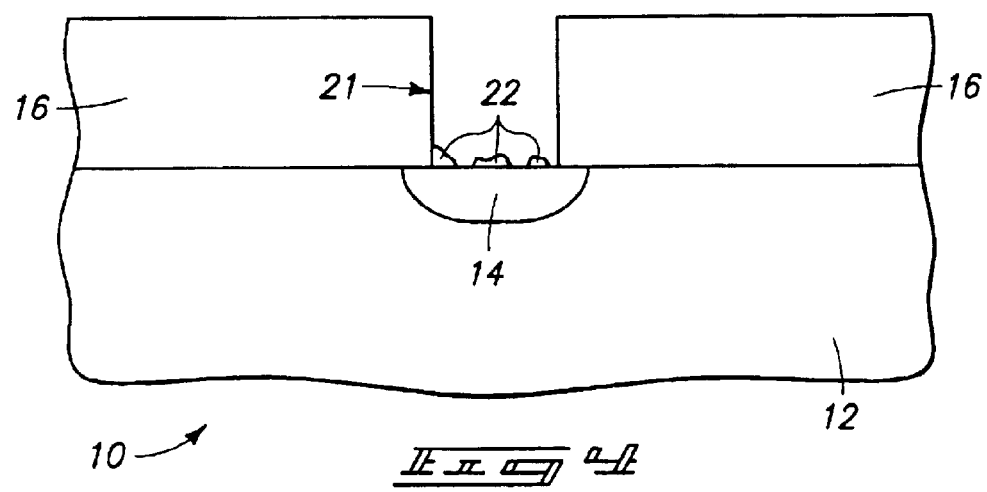
FIG. 4 is a view of the FIG. 1 wafer at a processing step subsequent to that shown by FIG. 3.

Referring to FIG. 4, masking layer 18 has been removed from the substrate after the etching to produce opening 21.

Figure 5:
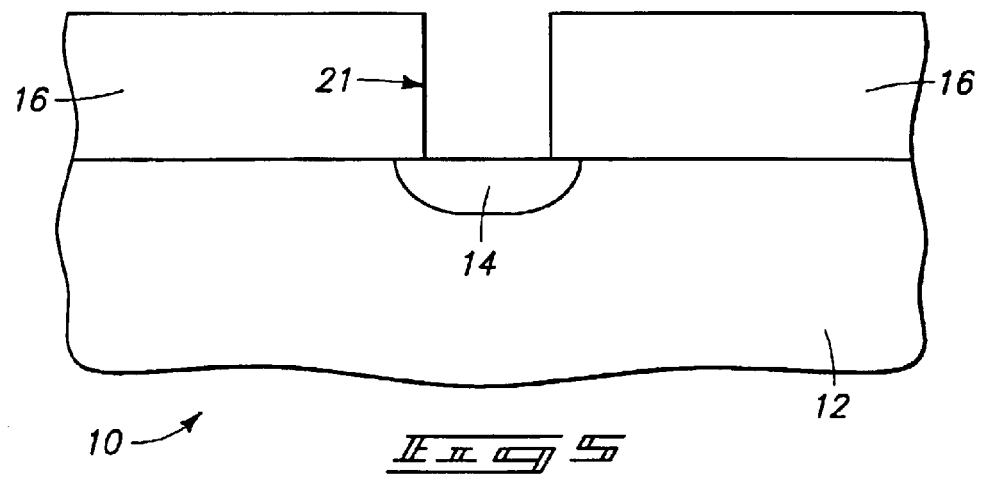
FIG. 5 is a view of the FIG. 1 wafer at a processing step subsequent to that shown by FIG. 4.

Referring to FIG. 5 and preferably before subsequently depositing any material over the substrate, plasma etching of the substrate is conducted. Preferably, such plasma etching is conducted to remove the undesired residue from the substrate, and more preferably is conducted to be selective relative to removal of layer 16 and all other exposed material of the wafer. The plasma etching is preferably conducted at a temperature of least 400° C., and even more preferably at a temperature of at least 600° C. Further, the temperature is preferably not allowed to rise above 800° C. Pressure is preferably maintained at from 1 mTorr to 10 Torr. The plasma preferably contains hydrogen or oxygen which in the case of a carbon containing material, such as a residue comprising a carbon polymer, is effective and substantially selective in removing such material from the substrate relative to the typical oxide and silicon materials on the wafer. Hydrogen or oxygen containing plasmas could be utilized alone, or the plasma might comprise some suitable combination. Preferably, the hydrogen containing plasma is derived at least in part from one or both of $H_2$ and $NH_3$. Further, the plasma can predominately comprise hydrogen. Example oxygen containing plasmas can be derived from, for example, $O_2$ and $O_3$. The plasma might also contain other reactive or inert gases, with Ar being but one example.

A specific example process utilized a 6-liter Applied Materials Centura 5200™ single-wafer reactor, which is a parallel plate capacitively coupled reactor. Preferred power in accordance with an aspect of the invention using such a reactor is from 100 to 1000 watts, with 300 watts being utilized in this example. Wafer temperature was maintained at 635° C., with reactor pressure being held at 1.5 Torr. The gas flow to the reactor was $H_2$ and Ar at respective flow rates of 2000 sccm and 1000 sccm. The etch was conducted on a wafer comprising a carbon polymer containing residue derived from a previous dry anisotropic etch of BPSG relative to a monocrystalline silicon substrate, with in this example a contact opening having an aspect ratio of 8:1 having previously been etched. The subsequent plasma etching was conducted for 30 seconds, and selectively removed the carbon containing polymer from the substrate relative to the otherwise exposed oxide and silicon materials.

Figure 6:
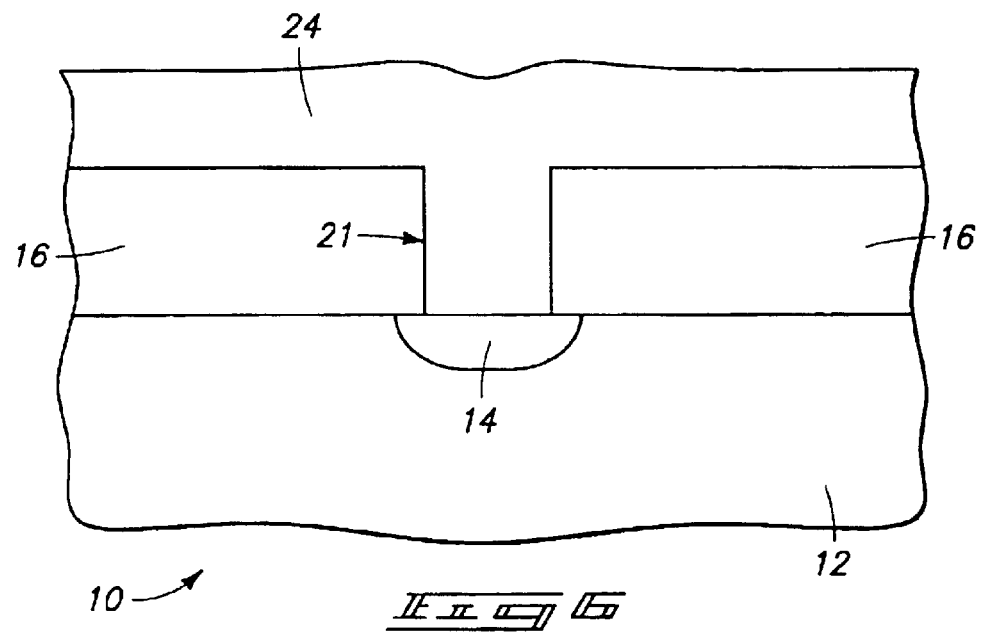
FIG. 6 is a view of the FIG. 1 wafer at a processing step subsequent to that shown by FIG. 5.

One preferred implementation of the invention comprises conducting such plasma etching within a plasma enhanced chemical vapor deposition reactor just prior to chemical vapor depositing of a film over the wafer in such reactor with or without plasma. In a preferred implementation, a semiconductor substrate is positioned within the plasma enhanced chemical vapor deposition reactor. The substrate has some residue such as a carbon containing polymer formed at least partially thereover, and typically as the result of previous processing, for example in other equipment (i.e., the substrate of FIG. 4). Plasma etching of the substrate is conducted within the reactor using a first gas chemistry, for example, the chemistries and conditions described above (i.e., to produce the result of FIG. 5.) After the plasma etching, a material is deposited, for example chemical vapor deposited with or without plasma, over the semiconductor substrate within the reactor using a suitable second deposition gas chemistry without removing the substrate from the reactor between the etching and the depositing (i.e, to produce a layer 24 such as shown in FIG. 6). Where the plasma etching and chemical vapor depositing are conducted both subatmospheric, the substrate is preferably not exposed to atmospheric or higher pressure conditions intermediate the plasma etching and the depositing. Example preferred materials for filling contact opening 21 include silicides at the base of the contact and overlying polysilicon or tungsten. The silicide can be formed, by way of example only, by refractory metal deposition and anneal, or by chemical vapor deposition directly of the silicide.

When etching with hydrogen after contact formation over a silicon containing substrate in accordance with an aspect of the invention, it has been discovered that silicide contacts at the base of the opening can have less than optimum conductivity. Apparently, a tenacious hydrogen-silicon bond can form on the silicon from the plasma treatment. Such can lead to formation of overly thin silicide in these portions, thus leading to increased resistance. Accordingly, a preferred additional plasma etching is conducted using another gas chemistry (preferably comprising chlorine, or hydrogen and chlorine) intermediate the etching with the first gas chemistry and depositing with the second gas chemistry. The chlorine is preferably derived from one or both of $Cl_2$ and HCl. Hydrogen might also be present from $H_2$.

Using the above described 6-liter reactor as an example, preferred power is from 100 to 1000 watts, with 200 watts being a specific example. Wafer temperature is preferably maintained between 200° C. and 800° C., with 200° C. and 400° C. being specific examples. Pressure is preferably maintained between 1 mTorr and 100 Torr, with 5 Torr being a specific example. An example gas flow would be 100 sccm of $Cl_2$ and 100 sccm of Ar. Where hydrogen is also being fed to the reactor, preferably at least 10% of the reactive gas flow will comprise hydrogen. One specific example would be a 1:1 volumetric flow ratio of $H_2$ to $Cl_2$. Etching time is preferably between 5 seconds and 30 seconds. Reduction to practice examples showed increased thickness of the silicide which was formed subsequently, increased conductivity, and lower chlorine and oxygen incorporation in the films after treatment with a chlorine containing plasma.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a conductive contact comprising:

forming an insulative material over a silicon comprising substrate;

forming an opening into the insulative material over a node location on the silicon comprising substrate to which electrical connection is desired;

first plasma etching within the opening using a gas chemistry comprising hydrogen and exposing silicon of the substrate to said plasma hydrogen;

after the first plasma etching, second plasma etching within the opening using a gas chemistry comprising chlorine; and after the second plasma etching, forming a silicide material within the opening in contact with silicon of the substrate.

2. The method of claim 1 wherein the silicide material is formed by refractory metal deposition and anneal.

3. The method of claim 1 wherein the silicide material is formed by chemical vapor deposition of the silicide material.

4. The method of claim 1 wherein the gas chemistry comprising hydrogen comprises $H_2$.

5. The method of claim 1 wherein the gas chemistry comprising chlorine comprises $Cl_2$.

6. The method of claim 1 wherein the gas chemistry comprising chlorine comprises HCl.

7. The method of claim 1 wherein the first plasma etching, the second plasma etching, and at least some of the silicide material forming all occur in the same chamber.

* * * * *

UNITED STATES PATENT AND TRADEMARK OFFICE
CERTIFICATE OF CORRECTION

PATENT NO. : 7,022,618 B2  
APPLICATION NO. : 10/664739  
DATED : April 4, 2006  
INVENTOR(S) : Sharan et al.

Page 1 of 1

It is certified that error appears in the above-identified patent and that said Letters Patent is hereby corrected as shown below:

Title Page  
(56) References Cited, U.S. Patent Documents – Insert --5,970,373 10/1999 Allen--.

Signed and Sealed this

Tenth Day of April, 2007

JON W. DUDAS  
*Director of the United States Patent and Trademark Office*